US012699324B2

(12) United States Patent
Kramer et al.

(10) Patent No.: US 12,699,324 B2
(45) Date of Patent: Aug. 4, 2026

(54) SUBSTRATE TABLE, LITHOGRAPHIC APPARATUS, STICKER, COVER RING AND METHOD OF OPERATING A LITHOGRAPHIC APPARATUS

(71) Applicant: ASML NETHERLANDS B.V., Veldhoven (NL)

(72) Inventors: Gijs Kramer, Nijmegen (NL); Christianus Wilhelmus Johannes Berendsen, Eindhoven (NL); Stijn Van Pelt, Den Bosch (NL); Marcus Martinus Petrus Adrianus Vermeulen, Leende (NL); Simon Karel Ravensbergen, Veldhoven (NL); Erik Willem Bogaart, Someren (NL)

(73) Assignee: ASML NETHERLANDS B.V., Veldhoven (NL)

( * ) Notice: Subject to any disclaimer, the term of this patent is extended or adjusted under 35 U.S.C. 154(b) by 152 days.

(21) Appl. No.: 18/727,740

(22) PCT Filed: Jan. 11, 2023

(86) PCT No.: PCT/EP2023/050502
§ 371 (c)(1),
(2) Date: Jul. 10, 2024

(87) PCT Pub. No.: WO2023/143909
PCT Pub. Date: Aug. 3, 2023

(65) Prior Publication Data
US 2025/0068085 A1 Feb. 27, 2025

(30) Foreign Application Priority Data
Jan. 31, 2022 (EP) .................................... 22154248

(51) Int. Cl.
*G03F 7/20* (2006.01)
*G03F 7/00* (2006.01)

(52) U.S. Cl.
CPC ...... *G03F 7/70341* (2013.01); *G03F 7/70716* (2013.01)

(58) Field of Classification Search
CPC ......................... G03F 7/70341; G03F 7/70716
See application file for complete search history.

(56) References Cited

U.S. PATENT DOCUMENTS 5,229,872 A     7/1993  Mumola
5,296,891 A     3/1994  Vogt et al.
(Continued)

FOREIGN PATENT DOCUMENTS

EP          1420298        5/2004
JP        2006202825       8/2006
(Continued)

OTHER PUBLICATIONS

International Search Report and Written Opinion issued in corresponding PCT Patent Application No. PCT/EP2023/050502, dated Apr. 6, 2023.

*Primary Examiner* — Mesfin T Asfaw
(74) *Attorney, Agent, or Firm* — Pillsbury Winthrop Shaw Pittman, LLP

(57) ABSTRACT

A substrate table, for use in an immersion lithographic apparatus, having a support area defining a support plane to support a substrate to be patterned and an upper surface surrounding the support area, wherein: the upper surface has an outer region that is substantially planar and a transition region proximate the support area; and the transition region is not co-planar with the outer region so as to ameliorate a level transition between the outer region and a non-standard substrate, which has a thickness different than a distance (Continued)

between the support plane and a nominal plane defined by
the outer region.

20 Claims, 13 Drawing Sheets

(56) References Cited

U.S. PATENT DOCUMENTS

| | | | |
|---|---|---|---|
| 5,523,193 A | 6/1996 | Nelson | |
| 2004/0160582 A1 | 8/2004 | Lof et al. | |
| 2004/0207824 A1 | 10/2004 | Lof et al. | |
| 2006/0103830 A1 | 5/2006 | Holmes et al. | |
| 2006/0103831 A1 | 5/2006 | Ottens et al. | |
| 2007/0242242 A1* | 10/2007 | Nagasaka | G03F 7/7085 |
| | | | 356/239.2 |
| 2008/0165331 A1 | 7/2008 | Jacobs et al. | |
| 2008/0186460 A1 | 8/2008 | Auer-Jongepier et al. | |
| 2008/0198346 A1* | 8/2008 | Iimura | G03F 7/70341 |
| | | | 355/30 |
| 2009/0218743 A1 | 9/2009 | Fujiwara et al. | |
| 2011/0116060 A1 | 5/2011 | Dziomkina et al. | |
| 2011/0199592 A1 | 8/2011 | De Graff et al. | |
| 2011/0292369 A1 | 12/2011 | Lafarre et al. | |
| 2015/0109599 A1 | 4/2015 | Koevoets et al. | |
| 2017/0010545 A1 | 1/2017 | Lof et al. | |
| 2018/0364584 A1 | 12/2018 | Van Sommeren et al. | |

FOREIGN PATENT DOCUMENTS

| | | |
|---|---|---|
| JP | 2015170799 | 9/2015 |
| WO | 99/49504 | 9/1999 |
| WO | 2022268438 | 12/2022 |

\* cited by examiner

SUBSTRATE TABLE, LITHOGRAPHIC APPARATUS, STICKER, COVER RING AND METHOD OF OPERATING A LITHOGRAPHIC APPARATUS

CROSS-REFERENCE TO RELATED APPLICATIONS

This application is the U.S. National phase entry of PCT Patent Application no. PCT/EP2023/050502 which was filed on Jan. 11, 2023, which claims priority of European Patent Application No. 22154248.3 which was filed on Jan. 31, 2022 and which is incorporated herein in its entirety by reference.

FIELD

The present invention relates to substrate tables, lithographic apparatus incorporating the substrate tables, stickers for use with substrate tables, cover rings for substrate tables and methods of operating lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

Immersion techniques have been introduced into lithographic systems to enable improved resolution of smaller features. In an immersion lithographic apparatus, a liquid layer of immersion liquid having a relatively high refractive index is interposed in a space between a projection system of the apparatus (through which the patterned beam is projected towards the substrate) and the substrate. The immersion liquid covers at last the part of the substrate under a final element of the projection system. Thus, at least the portion of the substrate undergoing exposure is immersed in the liquid. The effect of the immersion liquid is to enable imaging of smaller features since the exposure radiation will have a shorter wavelength in the immersion liquid than gas. (The effect of the liquid may also be regarded as increasing the effective numerical aperture (NA) of the system and also increasing the depth of focus.)

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final element and a surface facing the final element. The facing surface is a surface of substrate or a surface of a support table (or a substrate support) that is co-planar with the surface of the substrate. (Please note that reference in the following text to surface of the substrate also refers in addition or in the alternative to a surface of the substrate support, unless expressly stated otherwise; and vice versa). A fluid handling structure present between the projection system and the stage is used to confine the immersion to the space. The space filled by immersion liquid is smaller in plan than the top surface of the substrate and the space remains substantially stationary relative to the projection system while the substrate and substrate stage move underneath.

A fluid handling structure is a structure which supplies the immersion liquid to the space, removes the immersion liquid from the space and thereby confines the immersion liquid to the space. It includes features which are a part of a fluid supply system. FIGS. 2 and 3 show different supply devices which can be used in such a system. The arrangement disclosed in WO 99/49504 is an early fluid handling structure comprising pipes which either supply or recover the immersion liquid from the space and which operate depending on the relative motion of the stage beneath the projection system. In more recent designs the fluid handling structure extends along at least a part of a boundary of the space between the final element of the projection system and the support table or substrate, so as to in part define the space.

The fluid handing structure may have a selection of different functions. Each function may be derived from a corresponding feature that enables the fluid handling structure to achieve that function. The fluid handling structure may be referred to by a number of different terms, each referring to a function, such as barrier member, seal member, fluid supply system, fluid removal system, liquid confinement structure, etc. . . .

As a barrier member, the fluid handling structure is a barrier to the flow of the immersion liquid from the space. As a liquid confinement structure, the structure confines the immersion liquid to the space. As a seal member, sealing features of the fluid handling structure form a seal to confine the immersion liquid to the space. The sealing features may include an additional gas flow from an opening in the surface of the seal member, such as a gas knife.

During a series of exposures, the edge of the immersion liquid crosses the edge of the substrate repeatedly. These edge crossings are a significant source of defects in the manufactured devices due to disturbance of the meniscus of the immersion liquid.

SUMMARY

It is desirable to reduce defects attributable to edge crossings of the immersion liquid.

According to an aspect of the invention there is provided a substrate table, for use in an immersion lithographic apparatus, having a support area defining a support plane to support a substrate to be patterned and an upper surface surrounding the support area, wherein:

the upper surface comprises an outer region that is substantially planar and a transition region proximate the support area; and the transition region is not co-planar with the outer region so as to ameliorate a level transition between the outer region and a non-standard substrate, which has a thickness different than a distance between the support plane and a nominal plane defined by the outer region.

According to an aspect of the invention there is provided an immersion lithographic apparatus comprising:

a substrate table as described above;

a liquid confinement system configured to confine an immersion liquid to a space; and a positioning system configured to position the substrate table relative to the liquid confinement system.

According to an aspect of the invention there is provided a sticker for use with a substrate table of an immersion lithographic apparatus, the sticker having a shape and configuration to define a transition region of an upper surface of the substrate table, the transition region transition region being effective to reduce a level transition between an outer region of the upper surface of the substrate table and a substrate held by the substrate table, the substrate having a thickness greater than the height of the upper surface relative to the support plane for the substrate.

According to an aspect of the invention there is provided a cover ring for use with a substrate table of an immersion lithographic apparatus, the cover ring having a shape and configuration to define a transition region of an upper surface of the substrate table, the transition region being effective to reduce a level transition between an outer region of the upper surface of the substrate table and a substrate held by the substrate table, the substrate having a thickness different than the height of the upper surface relative to the support plane for the substrate.

According to an aspect of the invention there is provided a method of operating an immersion lithographic apparatus, the method comprising:

providing immersion liquid on an upper surface of a substrate table; and controlling the immersion liquid to move from the upper surface onto a substrate supported in a support area of the substrate table;

wherein the immersion liquid moves across a transition region when moving along the upper surface towards the substrate, the transition region being effective to reduce a level transition between an outer region of the upper surface of the substrate table and the substrate; and the substrate has a thickness different than a height of the upper surface relative to the support area.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include:

a programmable mirror array; more information on such mirror arrays is given in U.S. Pat. Nos. 5,296,891 and 5,523,193, which are incorporated herein by reference; and a programmable LCD array; an example of such a construction is given in U.S. Pat. No. 5,229,872, which is incorporated herein by reference.

Figure 1:
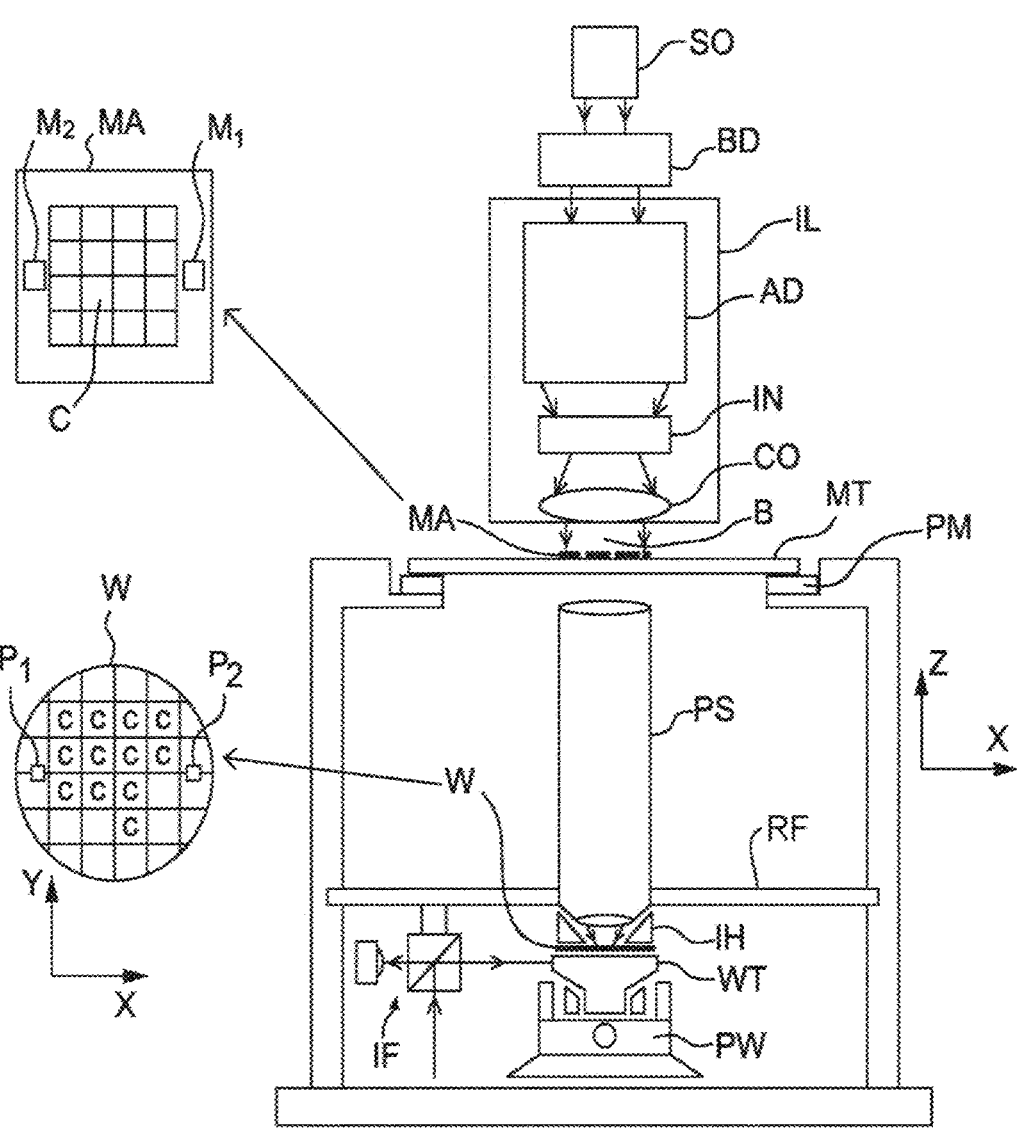
FIG. 1 depicts a lithographic apparatus according to an embodiment of the invention.

FIG. 1 schematically depicts a lithographic apparatus. The apparatus comprises:

optionally, an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

Referring to FIG. 1, in operation, the illumination system IL receives a radiation beam from a source SO or radiation, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid. Any use of the term "projection lens" herein may be considered as synonymous with the more general term "projection system".

The lithographic apparatus may be of a type having two or more support tables, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the patterning device MA, which is held on the support structure MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the support table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. Patterning device MA and substrate W may be aligned using patterning device alignment marks M1, M2 and substrate alignment marks P1, P2. Although the substrate alignment marks M1, M2 as illustrated occupy dedicated target portions, they may be located in spaces between target portions C (these are known as scribe-lane alignment marks).

Figure 2:
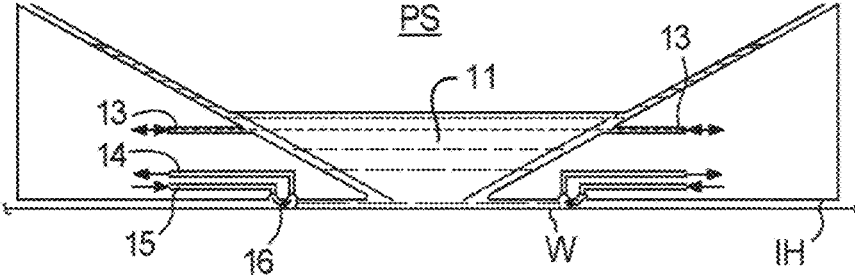
FIG. 2 depicts a liquid supply system for use in a lithographic projection apparatus.

FIG. 2 schematically depicts a localized liquid supply system or fluid handling system. The liquid supply system is provided with a fluid handling structure IH (or liquid confinement structure), which extends along at least a part of a boundary of the space 11 between the final element of the projection system PS and the support table WT or substrate W. The fluid handling structure IH is substantially stationary relative to the projection system PS in the XY plane though there may be some relative movement in the Z direction (in the direction of the optical axis). In an example, a seal is formed between the fluid handling structure IH and the surface of the substrate W and may be a contactless seal such as a gas seal (such a system with a gas seal is disclosed in EP1,420,298) or liquid seal.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS. Immersion liquid is brought into the space 11 below the projection system PS and within the fluid handling structure IH by one of liquid openings 13. The immersion liquid may be removed by another of liquid openings 13. The immersion liquid may be brought into the space 11 through at least two liquid openings 13. Which of liquid openings 13 is used to supply the immersion liquid and optionally which is used to remove the immersion liquid may depend on the direction of motion of the support table WT.

The immersion liquid may be confined in the space 11 by a contactless seal such as a gas seal 16 formed by a gas which, during use, is formed between the bottom of the fluid handling structure IH and the surface of the substrate W. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the immersion liquid. Such a system is disclosed in US 2004/0207824, which is hereby incorporated by reference in its entirety. In an example, the fluid handling structure IH does not have the gas seal 16.

Figure 3:
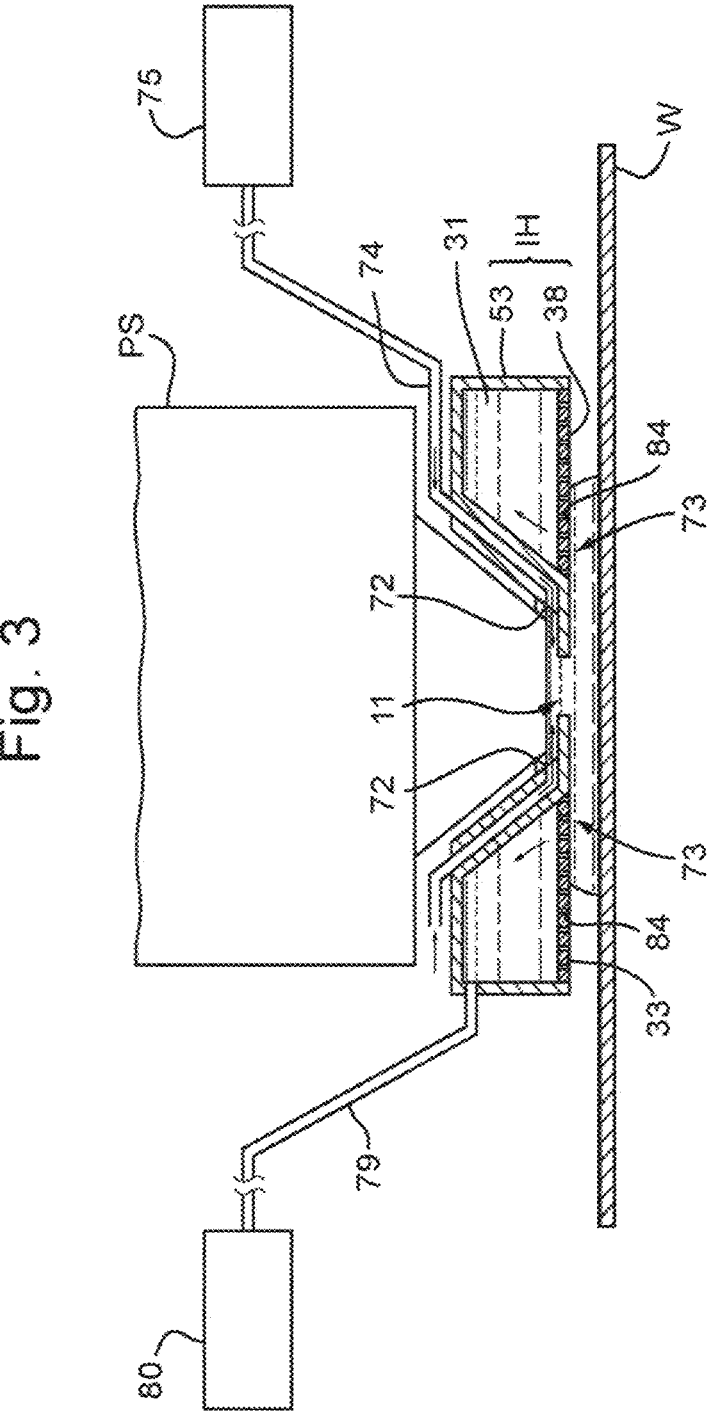
FIG. 3 is a side cross sectional view that depicts a further liquid supply system in which the invention can be applied.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH (or a liquid confinement structure), which extends along at least a part of a boundary of the space 11 between the final element of the projection system PS and the support table WT or substrate W.

The fluid handling structure IH at least partly confines the immersion liquid in the space 11 between the final element of the projection system PS and the substrate W. The space 11 is at least partly formed by the fluid handling structure IH positioned below and surrounding the final element of the projection system PS. In an example, the fluid handling structure IH comprises a main body member 53 and a porous member 33. The porous member 33 is plate shaped and has a plurality of holes (i.e., openings or pores). In an example, the porous member 33 is a mesh plate wherein numerous small holes 84 are formed in a mesh. Such a system is disclosed in US 2010/0045949 A1, which is hereby incorporated by reference in its entirety.

The main body member 53 comprises supply ports 72, which are capable of supplying the immersion liquid to the space 11, and a recovery port 73, which is capable of recovering the immersion liquid from the space 11. The supply ports 72 are connected to a liquid supply apparatus 75 via passageways 74. The liquid supply apparatus 75 is capable of supplying the immersion liquid to the supply ports 72 through the corresponding passageway 74. The recovery port 73 is capable of recovering the immersion liquid from the space 11. The recovery port 73 is connected to a liquid recovery apparatus 80 via a passageway 79. The liquid recovery apparatus 80 recovers the immersion liquid recovered via the recovery port 73 through the passageway 29. The porous member 33 is disposed in the recovery port 73. Performing the liquid supply operation using the supply ports 72 and the liquid recovery operation using the porous member 33 forms the space 11 between the projection system PS and the fluid handling structure IH on one side and the substrate W on the other side.

Figure 4:
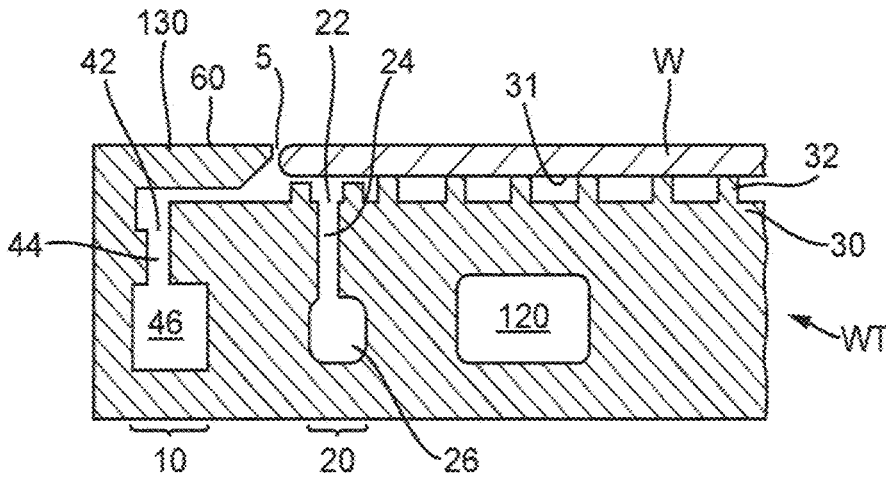
FIG. 4 depicts a part of a substrate table in a lithographic apparatus according to in which the invention can be applied.

FIG. 4 illustrates part of a lithographic apparatus according to an embodiment of the present invention. The arrangement illustrated in FIG. 4 and described below may be applied to the lithographic apparatus described above and illustrated in FIG. 1. FIG. 4 is a cross-section through a substrate table WT and a substrate W. A gap 5 exists between an edge of the substrate W and an edge of the substrate table WT. When the edge of the substrate W is being imaged or at other times such as when the substrate W first moves under the projection system PS (as described above), the immersion space 11 filled with liquid by the liquid confinement structure IH (for example) will pass at least partly over the gap 5 between the edge of the substrate W and the edge of the substrate table WT. This can result in liquid from the immersion space 11 entering the gap 5.

The substrate W is held by a support body 30 (e.g. a pimple or burl table) comprising one or more projections 32 (i.e., burls). The support body 30 is an example of an object holder. Another example of an object holder is a mask holder. An under-pressure applied between the substrate W and the substrate table WT helps ensure that the substrate W is held firmly in place. However, if immersion liquid gets between the substrate W and the support body 30 this can lead to difficulties, particularly when unloading the substrate W.

In order to deal with the immersion liquid entering that gap 5 at least one drain 10, 20 is provided at the edge of the substrate W to remove immersion liquid which enters the gap 5. In the embodiment of FIG. 4 two drains 10, 20 are illustrated though there may only be one drain or there could be more than two drains. In an embodiment, each of the drains 10, 20 is annular so that the whole periphery of the substrate W is surrounded.

A primary function of the first drain 10 (which is radially outward of the edge of the substrate W/support body 30) is to help prevent bubbles of gas from entering the immersion space 11 where the liquid of the liquid confinement structure IH is present. Such bubbles may deleteriously affect the imaging of the substrate W. The first drain 10 is present to help avoid gas in the gap 5 escaping into the immersion space 11 in the liquid confinement structure IH. If gas does escape into the immersion space 11, this can lead to a bubble which floats within the immersion space 11. Such a bubble, if in the path of the projection beam, may lead to an imaging error. The first drain 10 is configured to remove gas from the gap 5 between the edge of the substrate W and the edge of the recess in the substrate table WT in which the substrate W is placed. The edge of the recess in the substrate table WT may be defined by a cover ring 130 which is optionally separate from the support body 30 of the substrate table WT. The cover ring 130 may be shaped, in plan, as a ring and surrounds the outer edge of the substrate W. The first drain 10 extracts mostly gas and only a small amount of immersion liquid.

The second drain 20 (which is radially inward of the edge of the substrate W/support body 30) is provided to help prevent liquid which finds its way from the gap 5 to underneath the substrate W from preventing efficient release of the substrate W from the substrate table WT after imaging. The provision of the second drain 20 reduces or eliminates any problems which may occur due to liquid finding its way underneath the substrate W.

As depicted in FIG. 4, in an embodiment the lithographic apparatus comprises a channel 46 for the passage therethrough of a two phase flow. The channel 46 is formed within a block. The first and second drains 10, 20 are each provided with an opening 42, 22 and a channel 46, 26. The channel 46, 26 is in fluid communication with the respective opening 42, 22 through a passageway 44, 24.

As depicted in FIG. 4, the cover ring 130 has an upper surface 60. The upper surface 60 extends circumferentially around the substrate W on the support body 30. In use of the lithographic apparatus, the liquid confinement structure IH moves relative to the substrate table WT. During this relative movement, the liquid confinement structure IH moves across the gap 5 between the cover ring 130 and the substrate W. In an embodiment the relative movement is caused by the substrate table WT moving under the liquid confinement structure IH. In an alternative embodiment the relative movement is caused by the liquid confinement structure IH moving over the substrate table WT. In a further alternative embodiment the relative movement is provided by movement of both the substrate table WT under the liquid confinement structure IH and movement of the liquid confinement structure IH over the substrate table WT. In the following description, movements of the liquid confinement structure IH will be used to mean the relative movement of the liquid confinement structure IH relative to the substrate table WT.

Figures 5, 6:
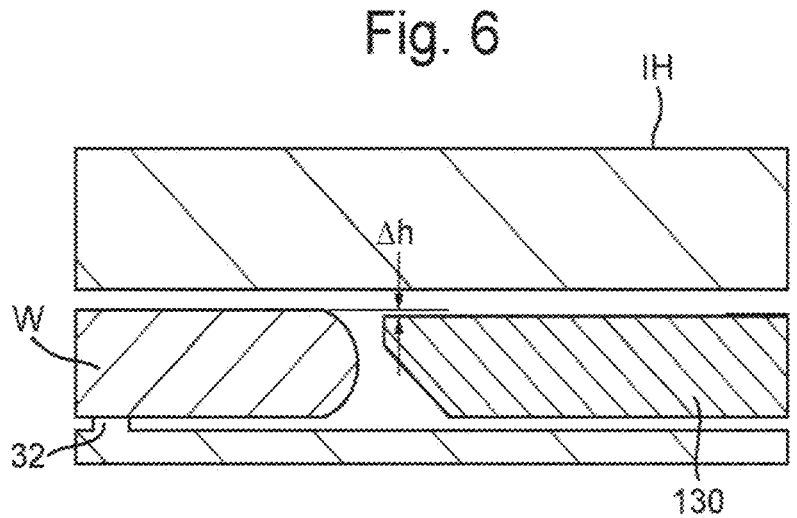
FIG. 5 depicts schematically a part of a conventional lithographic apparatus exhibiting a problem addressed by the present invention.
FIG. 6 is an enlarged view of a part of FIG. 5.

FIG. 5 is an enlarged view of a part of the lithographic apparatus, specifically the liquid confinement structure IH and substrate table WT in the vicinity of the edge of the substrate W. As mentioned above, the cover ring 130 provides an upper surface 60 immediately surrounding the substrate W. Conventionally this upper surface 60 is coplanar with substrate W if the substrate W has a standard thickness, e.g. 775 μm. Surrounding the cover ring 130 is a body, referred to herein as the encoder block 140, which supports various sensors and fiducials (reference marks) such as a transmission image sensor (TIS) which is used for aligning the substrate table WT to an image projected by the projection system PS and aligning the substrate W to the substrate table WT. The encoder block 140 may form the main part of the substrate table WT, extending under and supporting the support body 30. The encoder block 140 is desirably made of a material with a high rigidity and low coefficient of thermal expansion, such as Zerodur™ or Cordierite. A sticker 150 is provided to cover the gap between encoder block 140 and cover ring 130 to prevent immersion liquid entering the gap. Sticker 150 may be referred to as a film or foil and may be made of stainless steel, for example, and fixed to the cover ring 130 and encoder block 140 by a low-residue adhesive. The sticker

150 may be formed of glass, metal, plastic, or other non-reactive material. The sticker 150 may be secured by suction with an adhesive, thin film liquid, or vacuum.

If the immersion lithographic apparatus is used to pattern a substrate W having a thickness greater or smaller than the nominal thickness for which the lithographic apparatus is defined, there will be a height difference $\Delta h$ between the top of the substrate W and the top of the cover ring 130. The case where the wafer is thicker is shown in FIG. 6, which is a further enlargement of a part of FIG. 5. Note that this and subsequent figures are not drawn to scale and exaggerate certain vertical dimensions for clarity. One circumstance in which it is desirable to pattern a thick substrate is the manufacture of three-dimensional memory structures, e.g. 3D-NAND, where the structures built up on the substrate can add significant thickness to the substrate, e.g. 30 µm or more, which is greater than the normal tolerance in the substrate thickness. It may also be desirable to pattern a thinner substrate than standard, also resulting in a height difference between the tops of the substrate W and cover ring 130.

The present inventors have determined that the existence of a height difference (in either direction) between the tops of the substrate W and the cover ring 130 (or equivalent surface adjacent the edge of the substrate W) can be deleterious to the performance of a lithographic apparatus. For example, such a height difference can disturb the meniscus of the immersion liquid when it travels across the edge of the substrate W, in either directions. Disturbances to the meniscus of the immersion liquid can cause generation of bubbles in the immersion liquid and/or droplets breaking away from the immersion liquid and being left on the substrate W or cover ring 130. Both bubbles and droplets are known causes of defects in immersion lithographic apparatus.

It is proposed to provide a transition region 135 in the upper surface of the substrate table WT proximate the support area where the substrate W is held, the transition region 135 being (at least partly) not co-planar with an outer region of the upper surface of the substrate table WT so as to ameliorate a level transition between the outer region and a non-standard substrate. The effect of the transition region 135 can be: to make the level transition more gradual rather than abrupt; to break the level transition into two or more smaller transitions; to move the transition further away from the edge of the substrate W; or a combination of two or more of these effects. A gradual level transition or two or more smaller transitions may be less likely to disturb the meniscus than a single larger transition. Moving the transition away from the edge of the substrate W may mean that any disturbance of the meniscus is less likely to lead to defects in patterned substrates. It is desirable that the transition region is close to the edge of the substrate so that the meniscus of the immersion liquid is not disturbed by a gap. Specifically it is desirable that the innermost edge of the transition region is spaced from the outer edge of the support area by no more than 3 mm, desirably no more than 1 mm.

The height of the highest point of the transition region, or the depth of the lowest point depends on the expected thickness variation of the substrate. However, it is desirable that at least part of the transition region is at a distance from the nominal plane of greater than 10 µm, desirably greater than 20 µm. Desirably no part of the transition region is further than 300 µm from the nominal plane, desirably no further than 150 µm, more desirably no further than 50 µm.

As means to effect the amelioration of the level transition, the transition region 135 may therefore include a sloped or curved surface and/or one or more steps.

Figures 7, 8:
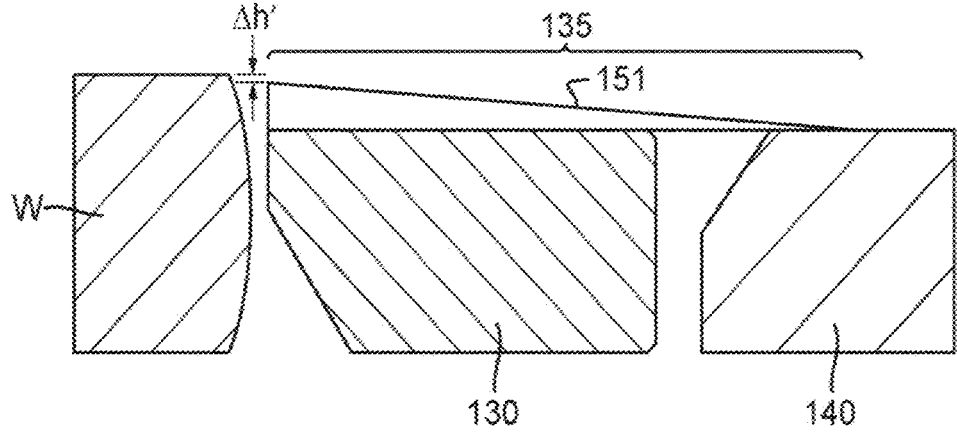
FIG. 7 depicts a part of a lithographic apparatus in which a first solution has been applied.
FIG. 8 depicts a part of a lithographic apparatus including a first practical embodiment of the first solution.

As shown in FIG. 7, an example of transition region 135 is a region of the upper surface adjacent the edge of the support area for the substrate W that is not coplanar with the outer region of the substrate table WT (here embodied by the upper surface of the encoder block 140) such that the level difference $\Delta h'$ between the upper surface of the substrate W and the highest point of the transition region 135 is less than the level different $\Delta h$ between the upper surface of the substrate W and the nominal plane defined by the outer region of the upper surface of the substrate table WT.

A variety of approaches to practical implementation of the transition region 135 are possible. A first approach is illustrated in FIG. 8 which shows a tapered sticker 151 that extends from the inner periphery of the cover ring 130 to the encoder block 140, covering the gap between the cover ring 130 and encoder block 140. Tapered sticker 151 can therefore replace sticker 150 in the conventional arrangement. Tapered sticker 151 can be formed of a polymer and shaped using laser ablation to the desired thickness profile. Other materials, including stainless steel are possible. Tapered sticker 151 is illustrated as having a linear variation in thickness with distance from its inner edge but other profiles are possible, including a staircase like profile with several shallow steps. Desirably the tapered sticker 151 has a thickness that reduces monotonically outwardly from its inner edge.

Figures 9, 10:
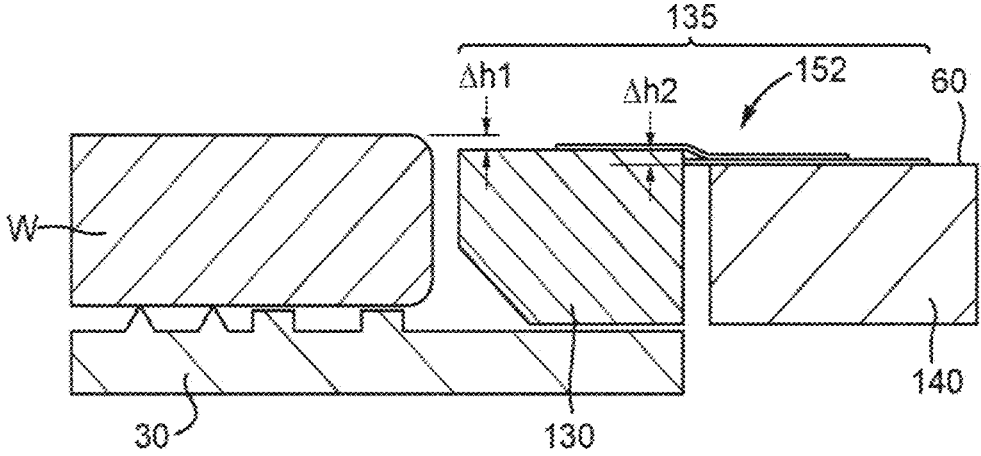
FIG. 9 depicts a part of a lithographic apparatus including a second practical embodiment of the first solution.
FIG. 10 depicts a part of a lithographic apparatus in which a second solution has been applied.

A second approach to practically implement a transition region 135 is depicted in FIG. 9. In this arrangement the transition region 135 is defined by a multilayer sticker 152 which comprises plural stickers, e.g. first sticker 152a and second sticker 152b, that have different shapes and are stacked on top of each other. More than two stickers can be used. As with the arrangement of FIG. 8, multi-layer sticker 152 extends from the inner periphery of the cover ring 130 to the encoder block 140, covering the gap between the cover ring 130 and encoder block 140. Multilayer sticker 152 can therefore replace sticker 150 in the conventional arrangement. FIG. 9 depicts the stickers stacked such that the stickers increase with size upwards (i.e. smallest sticker on the bottom). In this arrangement the larger sticker(s) smooth the step(s) formed by the outer edges of the smaller sticker(s) below. It is also possible to stack the stickers such that the stickers decrease in size upward; this presents steeper steps but may avoid the presence of voids in to which immersion liquid can penetrate. A further alternative is to have a stack of stickers of decreasing size but with the largest sticker on the top smoothing the steps formed by the lower stickers.

A multilayer sticker 152 is advantageous in allowing the use of materials for the sticker, e.g. stainless steel, in which it may be difficult to create a sticker having a varying height profile. It may also be advantageous where the level difference to be ameliorated is quite large. It is of course possible to combine the concepts of the arrangements of FIGS. 8 and 9, that is to have a multi-layer sticker formed of stickers having a varying height profile. For example, the edges of the stickers making up the multi-layer sticker may be chamfered, e.g. at 60°, so as to form a bevel.

Solutions employing stickers are advantageous in not requiring any changes to the cover ring 130 or encoder block 140. Therefore, sticker-based solutions can be retrofitted to existing apparatus in the field. The height of a sticker can be selected according to the recipe of the devices to be manufactured. If a lithographic apparatus is to be dedicated to patterning substrates of non-standard thickness for a sufficient period of time it can be economic to fit or change a sticker of appropriate thickness. Downtime required to fit or change a sticker can be minimised by use of a low-residue adhesive to hold the sticker in place.

It is desirable that a sticker used in the invention extends closer to the inner edge of the cover ring 130 than is conventional. A conventional sticker only covers sufficient of the cover ring 130 to enable proper adhesion. A sticker used in the invention desirably extend up to the inner edge of the cover ring 130. A sticker used in the invention may extend so that its inner edge is spaced from the outer edge of the support area by no more than 3 mm, desirably no more than 1 mm.

FIG. 10 depicts a part of a lithographic apparatus according to a second solution to the problem of an excessive level transition at the edge of the substrate W. As shown in FIG. 10, the cover ring 130 has a depth and/or position such that the level difference Δh between the outer region of the upper surface of the substrate table WT (e.g. defined by encoder block 140) is divided into two or more smaller level differences Δh1 and Δh2. For example, a first level difference Δh1 is defined between the top surface of the substrate W and the upper surface 60 of the cover ring 130 and a second level difference Δh2 is defined between the upper surface 60 of the cover ring 130 and the top surface of the encoder block 140. The ratio in which the total level difference Δh is divided between Δh1 and Δh2 can be selected for a given application. In general it is desirable that Δh1 and Δh2 are approximately the same or that Δh1 is less than Δh2. The transition region 135 is formed by the fact that the upper surface 60 of the cover ring 130 has a level intermediate the levels of the top surfaces of the substrate W and the encoder block 140.

The depth (thickness) of cover ring 130 can easily be determined during manufacture. To make a slightly thicker cover ring 130 is no more difficult than to make one of standard thickness. The vertical position of cover ring 130 can be determined by burls provided on support body 30 (not shown) or by providing a suitable spacer between the cover ring 130 and the support body 30.

In a variation of the second solution, the cover ring 130 is made in two parts separated by a horizontal plane. Versions of either the upper part or the lower part may be made in different thicknesses and exchanged to suit the thicknesses of substrates W to be patterned. The two parts of the cover ring 130 may be held together by, for example, magnets or a mechanical interlock.

In the second solution, a sticker 150 between the cover ring 130 and encoder block 140 may still be used to prevent immersion liquid entering the gap between cover ring 130 and encoder block 140. The sticker 150 may be a sticker according to the first solution to further ameliorate the level transition between encoder block 140 and substrate W.

Although a cover ring 130 is a more substantial component than a sticker, so that manufacturing cover rings to suit different thicknesses of substrate W is more expensive than manufacturing different stickers, a cover ring is also a field exchangeable component not requiring excessive down time to change. Therefore, a suitable cover ring can be fitted or changed when an apparatus is scheduled to pattern substrates of non-standard thickness for an extended period.

The second solution is also of particular utility when the substrate W is thinner than standard since the cover ring 130 can easily be made thinner. Where the substrate W is thinner than standard, a thinner cover ring 130 may be combined with a sticker of variable thickness that, in contrast to the stickers of the first solution, has a thickness that increases with distance from the inner periphery.

Figure 11:
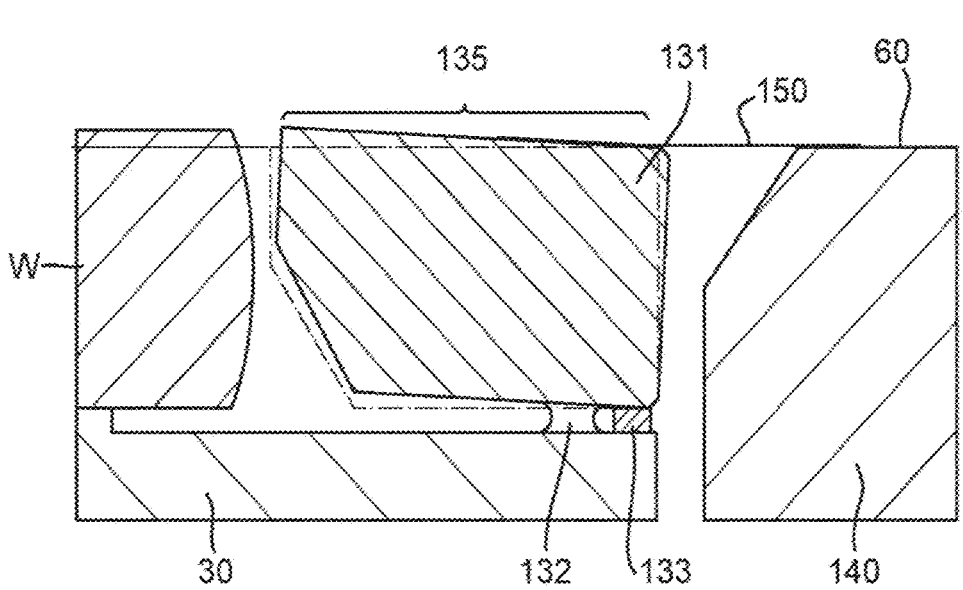
FIG. 11 depicts a part of a lithographic apparatus illustrating a third solution.

A third solution is depicted in FIG. 11. According to the third solution, the cover ring 131 is provided with an actuator 133 so that the shape of the upper surface 60 thereof can be varied to form a transition region 135. A controller (not shown) controls the actuator 133. The cover ring 131 has a default configuration, illustrated in the Figure by a dot-chain line, in which the upper surface of the cover ring 131 is coplanar with the upper surface of encoder block 140 and a substrate of standard thickness. Actuator 133 selectively pivots cover ring 131 about pivot 132 to form a transition region 135 between the encoder block 140 and a substrate of non-standard thickness. Although the Figure shows the cover ring 131 pivoting to accommodate a thicker substrate W, it can easily pivot in the opposite direction to accommodate a thinner substrate W.

Since the actuated cover ring 131 may have a width of 10 mm or more and the level difference that must be accommodated is likely to be less than 100 μm, only a small inclination is required. It will be appreciated that since the cover ring 131 is in the form of an annulus, inclining the cover ring 131 distorts it so that its upper surface 60 takes the form of a part-conical surface. Because of the small inclinations that are required, it is feasible to distort the cover ring 131 even if it is made of a relatively stiff material such as tungsten, stainless steel or SiSiC. The actuator 133 may be a piezoelectric device, a pneumatic device or a solenoid for example.

In the third solution, a sticker 150 between the cover ring 131 and encoder block 140 may still be used to prevent immersion liquid entering the gap between cover ring 131 and encoder block 140. A standard sticker 150 has ample flexibility to accommodate the movements of the actuated cover ring 131.

The third solution is advantageous in that the cover ring 131 can be switched to a desired configuration to suit the substrates to be patterned without opening the apparatus and in a short period of time. The third solution is therefore particularly applicable where smaller batches of substrates of different thicknesses are to be patterned.

Figure 12:
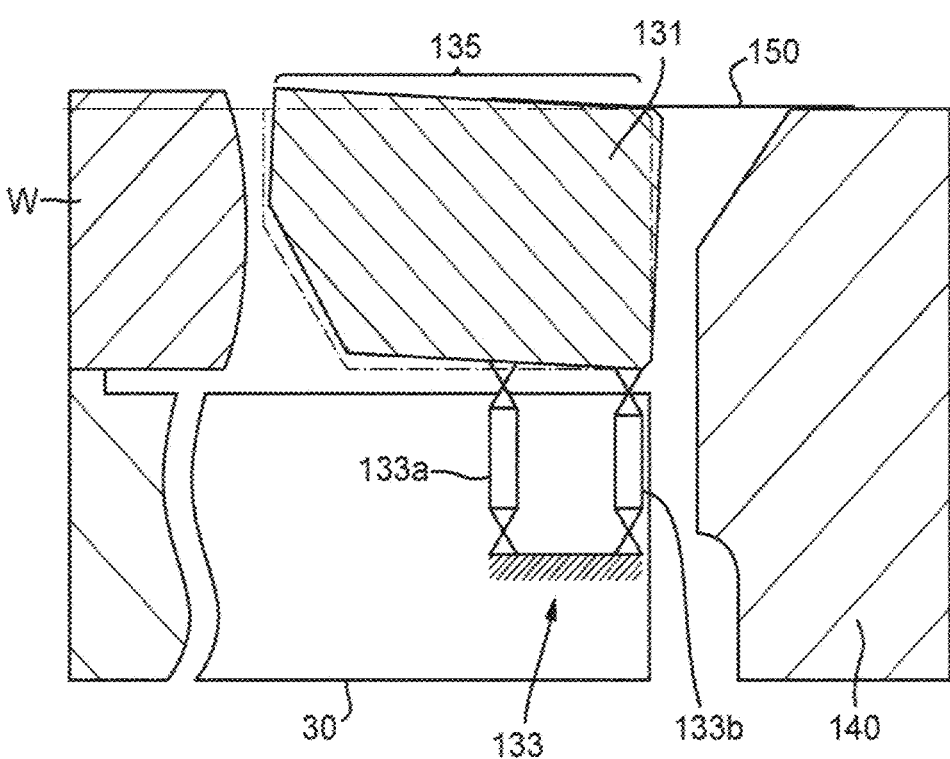
FIG. 12 depicts a part of a lithographic apparatus including a first variant of the third solution.

FIG. 12 depicts a first variant of the third solution. In this arrangement, the cover ring 131 is provided with two actuators 133a and 133b which are spaced apart in the radial direction of the substrate W. A controller (not shown) controls the actuators 133a, 133b. The use of two spaced-apart actuators 133a, 133b allows both the height and angle of the transition region 135 to be controlled, providing greater flexibility in adapting to substrates of different thicknesses. The lithographer is enabled to select what combination of level step(s) and inclined transition region 135 best suits the recipe being carried out.

Figure 13:
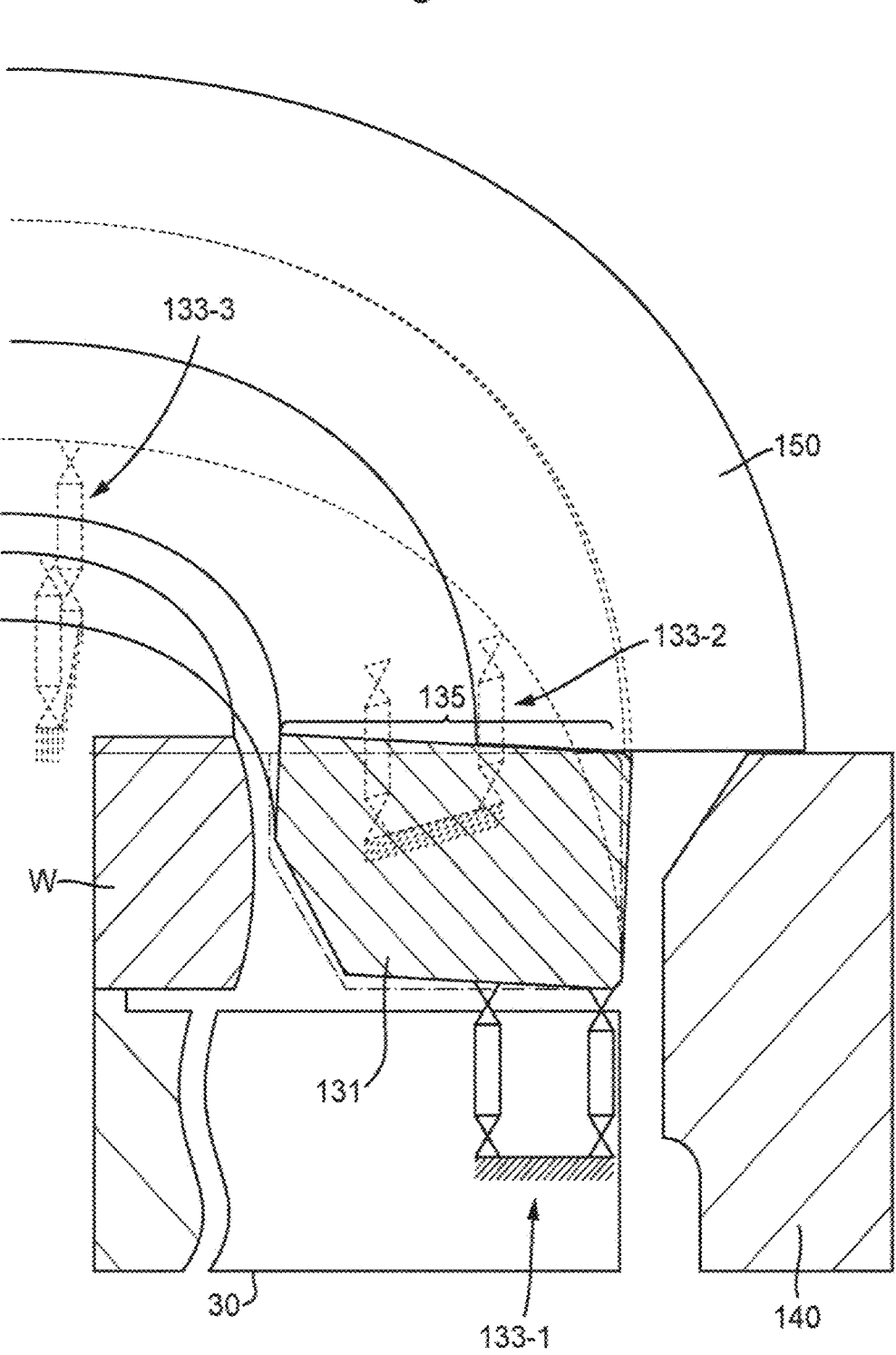
FIG. 13 depicts a part of a lithographic apparatus including a second variant of the third solution.

FIG. 13 depicts a second variant of the third solution. In this arrangement, the actuated cover ring 131 is provided with multiple actuator units 133-1 to 133-3 spaced around the ring in the circumferential direction. A controller (not shown) controls the actuator units 133-1 to 133-3. Each of the actuator units 133-1 to 133-3 may be a single actuator as in FIG. 11 or a pair of actuators 133a, 133b as in FIG. 12. The use of multiple actuator units 133 spaced around the cover ring 131 allows the profile of the transition region 135 to be controlled locally so that, for example, most of the cover ring 131 is flat but the cover ring 131 is moved or deformed to form a transition region 135 only where and when the liquid confinement structure IH crosses the cover ring 131. Local distortion of the cover ring 131 may reduce stresses imposed on the cover ring 131 and power consumption of the actuator units 133.

Figures 17, 18A, 18B:
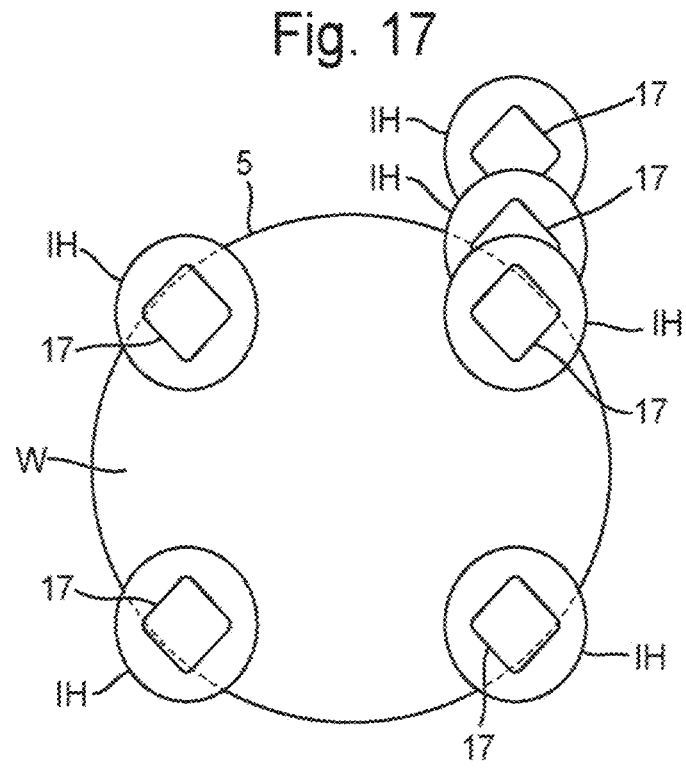
FIG. 17 depicts movements of a substrate relative to a liquid confinement system.
FIGS. 18A and 18B depict in cross-section a covering according to a fourth solution in lowered and raised position.

FIG. 17 depicts, in plan, various positions of the liquid confinement structure IH at different points in time relative to the substrate W and the gap 5. In particular, FIG. 17 is a schematic representation of moments when the liquid confinement structure IH crosses the gap 5 around the edge of the substrate W. FIG. 17 shows the crossings of the liquid confinement structure IH that result in the meniscus 17 at the trailing edge of the immersion space 11 being substantially parallel to the gap 5 at a point in time during the crossing. The meniscus 17 may not be exactly parallel to the gap 5, in particular because the gap 5 itself is substantially circumferential around the substrate W. However, as shown in FIG. 17 the meniscus 17 is substantially parallel to the gap 5. Accordingly, these crossing are sometimes called parallel crossings between the liquid confinement structure IH and the gap 5. It is known that parallel crossings have a higher probability of deposition of water droplets on the substrate W and consequently there is a greater probability of defects in the vicinity of the locations of parallel crossings.

Accordingly, in the second variant of the third solution, actuator units 133 may be placed only in the vicinity of the parallel crossings and/or only activated to form a transition region 135 when a parallel crossing occurs. Similarly in the static solutions described above, the profile of the sticker 150 and/or cover ring 131 may vary in the circumferential direction so that a transition region 135 is only provided in the regions where disturbance of the meniscus 17 is most likely to occur and/or lead to defects.

Figure 14:
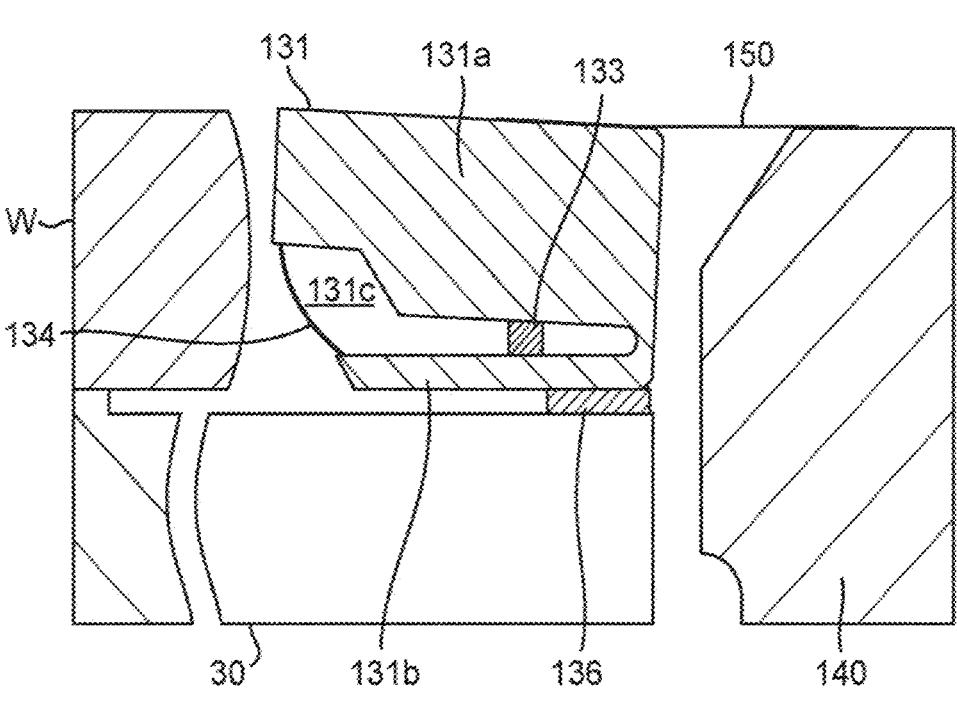
FIGS. 14 to 16 depict alternative actuator arrangements usable in the third solution.

FIG. 14 depicts an alternative actuator arrangement that can be used in any embodiment of the third solution. As shown in FIG. 14, the actuated cover ring 131 is divided into a first section 131a and a second section 131b by a slit 131c that extends into the cover ring 131 from its inner periphery. Actuator unit(s) 133 are disposed in the slit 131c so as to act between first section 131a and second section 131b. A controller (not shown) controls the actuator unit(s) 133. A flexible membrane 134 closes the slit 131c to prevent ingress of immersion liquid. The second section 131b of cover ring 131 is mounted to support body 30 via mount 136. This arrangement enables the actuated cover ring 131 to be constructed as a drop-in replacement for a conventional cover ring, requiring no mechanical modification of the support body 30.

Figure 15:
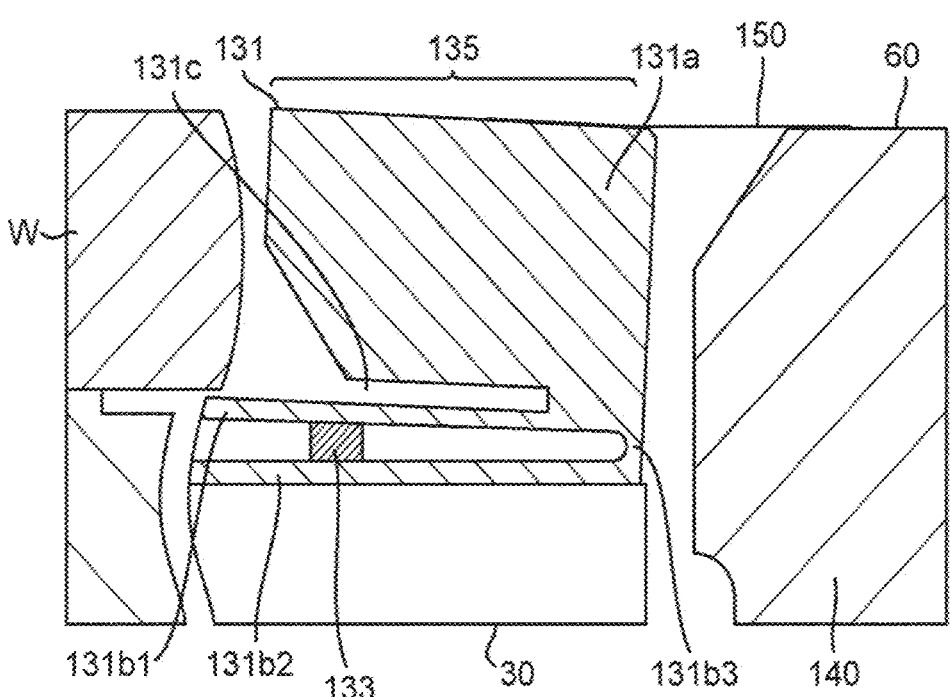

FIG. 15 depicts another alternative actuator arrangement that can be used in any embodiment of the third solution. As shown in FIG. 15, the actuated cover ring 131 is divided into a first section 131a and a second section 131b by a slit 131c that extends into the cover ring 131 from its inner periphery. The second section 131b is itself divided into two elongate arms 131b1 and 131b2 joined at junction 131b3. Actuator 133 is located between elongate arms 131b1 and 131b2 and acts to separate them. A controller (not shown) controls the actuator 133. When actuator 133 is actuated, the elongate arms 131b1 and 131b2 are forced apart and junction 131b3 bends so that the first part 131a rotates to the desired angle. By making elongate arms 131b1 and 131b2 long and junction 131b3 thin, a desired inclination of the upper surface 60 of the actuated cover ring 131 can be achieved with a low force actuator.

Figure 16:
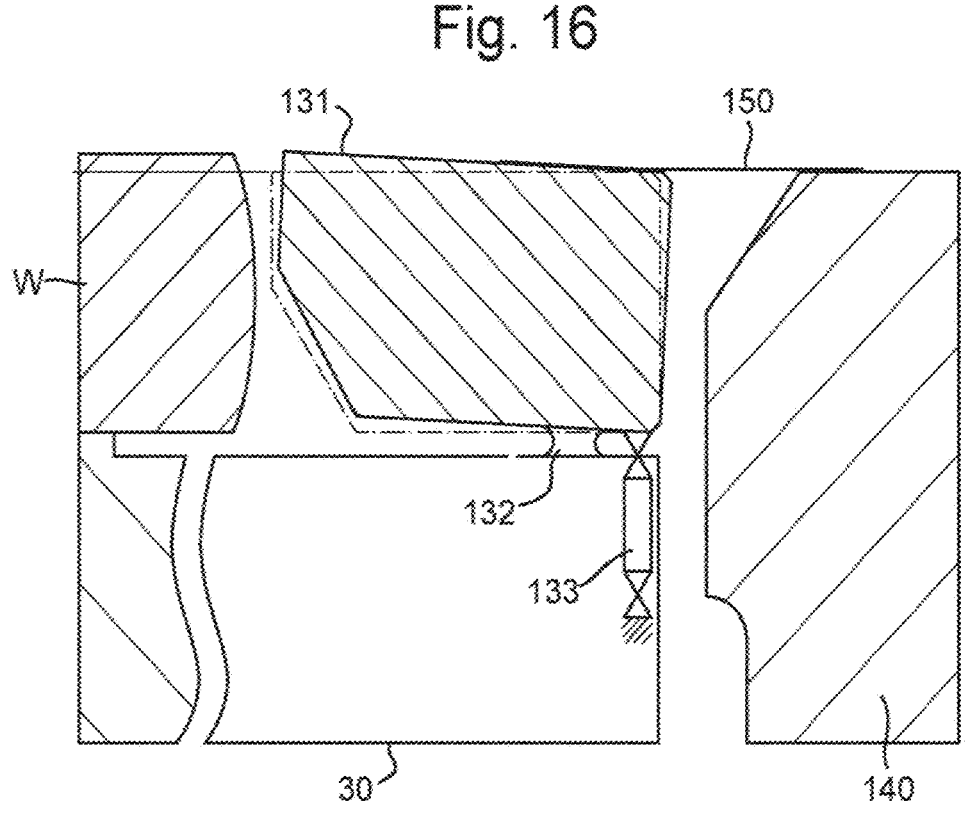

FIG. 16 depicts another alternative actuator arrangement that can be used in any embodiment of the third solution. Actuator 133 can be a push-pull actuator (i.e. an actuator that exerts controllable forces in both directions rather than one which exerts a force in one direction only). Actuator 133 can be embedded in support body 30 and provided with hinges to reduce perpendicular forces. Actuator 133 can be configured to exert a linear force on cover ring 131 or a torque. Spacing between pivot 132 and actuator 131 can be selected according to the force exertable by actuator 133 and the torque required for a desired shape of transition region 135.

A fourth solution is depicted in FIGS. 18a and b. In the fourth solution, the cover ring 130 is actuated to selectively raise and lower its upper surface according to the thickness of a substrate to be patterned.

As shown in FIGS. 18a and b, cover ring 130 comprises a ring-element 160, embedded at an upper-surface 162 thereof. The ring-element 160 is a deformable element comprising a piezo-electric, a magnetostrictive, or an electrostrictive material. In a first mode, a ring-element upper-surface 161 is arranged co-planar with the upper-surface 162 of the cover ring 130, as illustrated in FIG. 18a. In a second mode, the ring-element 160 is "activated" (e.g., by applying a voltage, a magnetic field, or an electric field) and thereby the element upper-surface 161 is raised with respect to the upper-surface 162, as shown in FIG. 18b, and forms a transition region. By the amount of activation, the height of the element 160 can be controlled to a desired level, e.g. to become co-planar with the top surface of a substrate W or intermediate the level of the top surface of the substrate W and the top surface of the outer region of the substrate table WT. A controller (not shown) controls the activation of the ring element 160. The cover ring 130 may comprise conductive leads to provide (locally) a voltage or a current at the ring-element 160 to initiate and to control the amount of activation (height level of the upper-surface 162).

A deformable filler material may be provided to (partially) fill the gap between the ring-element 160 and the cover ring 130. A foil, for example the sticker 150, may be provided at the upper-surfaces covering at least a portion of the upper-surface 161 of the ring-element 160 and the upper-surface 162 of the cover ring 130, thereby covering the gap. It will be appreciated that the arrangement of FIGS. 18a and 18B may be inverted so that the ring element 160 is at the bottom and when activated pushes against a support, e.g. support body 30, to raise the cover ring 130.

Figures 19A, 19B, 19C:
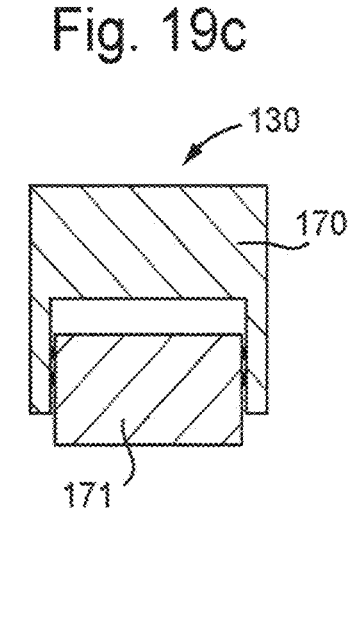
FIGS. 19A to 19C depict a part of a covering according to a variation of the fourth solution.

A variant of the fourth solution is depicted in FIGS. 19a to c. According to this arrangement, the cover ring 130 comprises a first (or bottom) ring 171 and a second (or top) ring 170. The second ring 170 is arranged to move coaxially with respect to the first ring 171. That is, the second ring 170 may rotate around a common axis (not shown) by means of a sliding structure 172, for example one or more threads or cam surfaces. By the rotational movement, the second ring 170 moves upwards. Thereby the level of an upper-surface 162 of the second ring 170 can be controlled to form the transition region. Thus, the upper-surface 162 can be controlled to a desired level, e.g. to become co-planar with the top surface of a substrate W or intermediate the level of the top surface of the substrate W and the top surface of the outer region of the substrate table WT.

A controller (not depicted in the Figure) may be used to set the position of the second ring 170. The controller may control, for example, an electromotor (not shown) that initiates the rotational movement of the second ring 170 with respect to the first ring 171, herewith elevating the upper-surface 162. The device that rotates second ring 170 may be an ultrasonic motor, a piezo-electric actuator, or a hydraulic actuator.

It will be appreciated that the arrangement of FIGS. 19a to c can be varied, for example by providing one or more channels in the upper surface of lower ring 171 provided with the threads or cam surfaces and corresponding projections (e.g. flanges or pins) in the lower surface of upper ring 170. A mechanism similar to e-pin mechanisms used to raise and lower the substrate W during loading and unloading can also be used.

It will be appreciated that actuated solutions of the present invention, e.g. the third and fourth solutions described above, may be capable of positioning the upper surface of the transition region 135 continuously over a range of positions and/or inclinations or at a selected one of a set of pre-set positions and/or inclinations. The position and/or inclination of the transition region 135 may be determined in advance based on the recipe to be applied to a batch of substrates. The position and/or inclination of the transition region 135 may be determined on a substrate-by-substrate basis based on measurements taken on specific substrates, e.g. in a characterisation process carried out in the lithographic apparatus before exposure. For example, a level sensor (not depicted in the Figure) may be used to determine the level of the substrate W or of edge regions of the substrate W relative to the outer region of the top surface of the substrate table WT in order to set an appropriate position or inclination for the transition region 135.

In actuated solutions of the present invention, the position or inclination for the transition region 135 may be set at a suitable time point before exposures begin and maintained constant until exposures of one or more substrates are complete. Alternatively the actuation may be changed during the exposure process, e.g. to set a transition region 135 only during some or all substrate edge crossings.

In solutions of the present invention where the cover ring forms the transition region 135, whether by means of a special shape of the cover ring or by actuation of the cover ring, it is desirable that the inner edge of the cover ring, or the part of the cover ring that forms the transition region 135, is spaced from the outer edge of the support area by no more than 3 mm, desirably no more than 1 mm.

Thus the present invention enables an immersion lithographic apparatus to be used to expose substrates with a wider range of thicknesses than has been possible, whether the variation results from differences in the base thickness of the substrates or structures formed thereon. This can be achieved through interchange of field-replaceable components between batches of substrates or using actuated solutions. An existing immersion lithographic apparatus can be retro-fitted to expose substrates of a different nominal thickness than those it was intended to expose. A new immersion lithographic apparatus can be constructed to expose substrates of non-standard thickness without needing to redesign other components of the substrate table WT, e.g. the encoder block 140, to place the whole upper surface at a different level. The encoder block 140 is, for example, a complex component with exacting manufacturing specifications so that to redesign it is a substantial amount of work. It is also advantageous to be able to use the same encoder block 140 in immersion lithographic apparatuses optimised for different substrate thicknesses.

In some embodiments of the invention, the shape and configuration of certain components is important. The present invention may therefore be embodied in a computer readable medium storing data which defines both a digital representation of the component and operating instructions adapted to control a computer aided manufacturing machine, such as an additive manufacturing device or a subtractive manufacturing device such as a laser ablation device, to fabricate the product using the digital representation of the product when said data is relayed to the computer aided manufacturing machine.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Exemplary embodiments of the invention are set out in the following numbered clauses:

1. A substrate table, for use in an immersion lithographic apparatus, having a support area defining a support plane to support a substrate to be patterned and an upper surface surrounding the support area, wherein:
   the upper surface comprises an outer region that is substantially planar and a transition region proximate the support area; and
   the transition region is not co-planar with the outer region so as to ameliorate a level transition between the outer region and a non-standard substrate, which has a thickness different than a distance between the support plane and a nominal plane defined by the outer region.
2. The substrate table of clause 1, wherein the transition region forms an annulus surrounding the support area.
3. The substrate table of clause 1 wherein the transition region extends along one or more discrete regions around the support area.
4. The substrate table of clause 1, 2 or 3 wherein the innermost edge of the transition region is spaced from the outer edge of the support area by no more than 3 mm, desirably no more than 1 mm.
5. The substrate table of any preceding clause wherein at least part of the transition region is at a distance from the nominal plane of greater than 10 μm, desirably greater than 20 μm.
6. The substrate table of any preceding clause wherein no part of the transition region is further than 300 μm from the nominal plane, desirably no further than 150 μm, more desirably no further than 50 μm.
7. The substrate table of any preceding clause wherein the transition region comprises a slope region that is inclined relative to the nominal plane and adjacent the outer region.
8. The substrate table of any preceding clause wherein the transition region comprises at least one step.
9. The substrate table of any preceding clause wherein the transition region projects upwardly from the outer region.
10. The substrate table of any of clauses 1 to 8 wherein the transition region extends downwardly from the outer region.
11. The substrate table of any preceding clause wherein the transition region comprises a sticker adhered to a surface substantially coplanar with the outer region.
12. The substrate table of clause 11 wherein the transition region comprises a further sticker adhered to the sticker.
13. The substrate table of clause 11 or 12 wherein the substrate table comprises a body that defines the outer region and a cover ring surrounding the support area; and the sticker or the further sticker bridges a gap between the cover ring and the outer region.
14. The substrate table of any of clauses 11 to 13 wherein the sticker or the further sticker is made of a polymer.
15. The substrate table of any of clauses 1 to 10 wherein the substrate table comprises a body that defines the outer region and a cover ring surrounding the support area, wherein the cover ring defines the transition region.

16. The substrate table of clause 15 wherein the cover ring comprises an upper ring part and a lower ring part, the upper ring part defining the transition region and being separable from the lower ring part.

17. The substrate table of clause 15 wherein the cover ring comprises a lower ring part, an upper ring part, the upper ring part defining the transition region, and an actuator configured to change the position of the upper ring part relative to the nominal plane.

18. The substrate table of clause 15 further comprising an actuator connected to the cover ring and configured to selectively alter the profile of the transition region.

19. The substrate table of clause 18 wherein the actuator is configured to alter the shape of the cover ring.

20. The substrate table of clause 19 wherein the actuator is configured to change the shape of the whole of the cover ring.

21. The substrate table of clause 20 wherein the actuator is configured to change the shape of the cover ring between a first configuration in which the transition region conforms to a plane and a second configuration in which the transition region is a part conical surface.

22. The substrate table of clause 19 wherein the actuator is configured to alter the shape of the cover ring locally.

23. The substrate table of any of clauses 18 to 22 wherein the actuator is configured to act between the cover ring and a main body of the substrate table.

24. The substrate table of any of clauses 18 to 22 wherein the actuator is integrated in the cover ring and acts between two parts thereof.

25. The substrate table of any clause 24 wherein the actuator is configured to rotate one part of the cover ring relative to the other.

26. An immersion lithographic apparatus comprising:
a substrate table according to any one of the preceding clauses;
a liquid confinement system configured to confine an immersion liquid to a space; and
a positioning system configured to position the substrate table relative to the liquid confinement system.

27. An immersion lithographic apparatus according to clause 26 when dependent on any of clauses 18 to 25 further comprising a controller to control the actuator in association with movement of the substrate table by the positioning system.

28. A sticker for use with a substrate table of an immersion lithographic apparatus, the sticker having a shape and configuration to define a transition region of an upper surface of the substrate table, the transition region transition region being effective to reduce a level transition between an outer region of the upper surface of the substrate table and a substrate held by the substrate table, the substrate having a thickness greater than the height of the upper surface relative to the support plane for the substrate.

29. A cover ring for use with a substrate table of an immersion lithographic apparatus, the cover ring having a shape and configuration to define a transition region of an upper surface of the substrate table, the transition region being effective to reduce a level transition between an outer region of the upper surface of the substrate table and a substrate held by the substrate table, the substrate having a thickness different than the height of the upper surface relative to the support plane for the substrate.

30. The cover ring of clause 29 wherein the cover ring comprises an upper ring part and a lower ring part, the upper ring part defining the transition region and being separable from the lower ring part.

31. The cover ring of clause 29 wherein the cover ring comprises a lower ring part, an upper ring part, the upper ring part defining the transition region, and an actuator configured to change the position of the upper ring part relative to the nominal plane.

32. The cover ring of clause 31 wherein the actuator is configured to change the shape of the cover ring between a first configuration in which the transition region conforms to a plane and a second configuration in which the transition region is a part conical surface.

33. The cover ring of clause 31 wherein the actuator is configured to alter the shape of the cover ring locally.

34. The cover ring of any clause 31 wherein the actuator is configured to rotate one part of the cover ring relative to the other.

35. A computer readable medium storing data which defines both a digital representation of the product of clause 28 or 29 and operating instructions adapted to control a computer aided manufacturing machine, such as an additive manufacturing device or a subtractive manufacturing device such as a laser ablation device, to fabricate the product using the digital representation of the product when said data is relayed to the computer aided manufacturing machine.

36. A method of operating an immersion lithographic apparatus, the method comprising:
providing immersion liquid on an upper surface of a substrate table; and
controlling the immersion liquid to move from the upper surface onto a substrate supported in a support area of the substrate table;
wherein the immersion liquid moves across a transition region when moving along the upper surface towards the substrate, the transition region being effective to reduce a level transition between an outer region of the upper surface of the substrate table and the substrate; and
the substrate has a thickness different than a height of the upper surface relative to the support area.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A substrate table for use in an immersion lithographic apparatus, the substrate table comprising a support area defining a support plane to support a substrate to be patterned and an upper surface surrounding the support area, wherein:
the upper surface comprises an outer region that is substantially planar and a transition region proximate the support area;
the transition region is a separate structure from the outer region; and
the transition region is not co-planar with the outer region so as to ameliorate a level transition between the outer region and a non-standard substrate, which has a thickness different than a distance between the support plane and a nominal plane defined by the outer region.

2. The substrate table of claim 1, wherein the transition region forms an annulus surrounding the support area or extends along one or more discrete regions around the support area.

3. The substrate table of claim 1, wherein the innermost edge of the transition region is spaced from the outer edge of the support area by no more than 3 mm.

4. The substrate table of claim 1, wherein the transition region comprises a sticker adhered to a surface substantially coplanar with the outer region.

5. The substrate table of claim 4, wherein the transition region comprises a further sticker adhered to the sticker.

6. The substrate table of claim 4, wherein the substrate table comprises a body that defines the outer region and a cover ring surrounding the support area, and the sticker bridges a gap between the cover ring and the outer region; and/or wherein the sticker is made of a polymer.

7. The substrate table of claim 1, wherein the substrate table comprises a body that defines the outer region and a cover ring surrounding the support area, wherein the cover ring defines the transition region.

8. The substrate table of claim 7, wherein the cover ring comprises a lower ring part and an upper ring part, the upper ring part defining the transition region, and an actuator configured to change the position of the upper ring part relative to the nominal plane; or further comprising an actuator connected to the cover ring and configured to selectively alter the profile of the transition region.

9. The substrate table of claim 8, wherein the actuator is configured to alter or change the shape of at least part of the cover ring.

10. The substrate table of claim 9, wherein the actuator is configured to alter or change the shape of the cover ring between a first configuration in which the transition region conforms to a plane and a second configuration in which the transition region is a part conical surface.

11. The substrate table of claim 8, wherein the actuator is configured to act between the cover ring and a main body of the substrate table or wherein the actuator is integrated in the cover ring and acts between two parts thereof.

12. The substrate table of claim 11, wherein the actuator is configured to rotate one part of the cover ring relative to the other.

13. The substrate table of claim 7, wherein the cover ring comprises an upper ring part and a lower ring part, the upper ring part defining the transition region and being separable from the lower ring part.

14. An immersion lithographic apparatus comprising:
the substrate table according to claim 1;
a liquid confinement system configured to confine an immersion liquid to a space; and
a positioning system configured to position the substrate table relative to the liquid confinement system.

15. The substrate table of claim 1, wherein at least part of the transition region is at a distance from the nominal plane of greater than 10 pm, and/or wherein no part of the transition region is further than 300 pm from the nominal plane, and/or wherein the transition region comprises a slope region that is inclined relative to the nominal plane and adjacent the outer region, and/or wherein the transition region comprises at least one step, and/or wherein the transition region projects upwardly or extends downwardly from the outer region.

16. A sticker for use with a substrate table of an immersion lithographic apparatus, the sticker having a shape and configuration to define a transition region of an upper surface of the substrate table, the transition region being effective to reduce a level transition between an outer region of the upper surface of the substrate table and a substrate held by the substrate table, the substrate having a thickness greater than the height of the upper surface of the outer region relative to the support plane for the substrate.

17. The sticker of claim 16, wherein the transition region comprises a further sticker adhered to the sticker.

18. A cover ring for use with a substrate table of an immersion lithographic apparatus, the cover ring having a shape and configuration to define a transition region of an upper surface of the substrate table, the transition region being effective to reduce a level transition between an outer region of the upper surface of the substrate table and a substrate held by the substrate table, the outer region being a separate structure from the cover ring and the substrate having a thickness different than the height of the upper surface of the outer region relative to the support plane for the substrate.

19. The ring of claim 18, comprising an upper ring part and a lower ring part, the upper ring part defining the transition region and being separable from the lower ring part.

20. The ring of claim 19, further comprising an actuator configured to change the position of the upper ring part relative to the lower ring part.

* * * * *